United States Patent
Utsumi et al.

(10) Patent No.: US 10,756,200 B2
(45) Date of Patent: Aug. 25, 2020

(54) SILICON CARBIDE SEMICONDUCTOR ELEMENT AND METHOD OF MANUFACTURING SILICON CARBIDE SEMICONDUCTOR

(71) Applicant: FUJI ELECTRIC CO., LTD., Kawasaki-shi, Kanagawa (JP)

(72) Inventors: Makoto Utsumi, Matsumoto (JP); Yasuhiko Oonishi, Matsumoto (JP); Kenji Fukuda, Tsukuba (JP); Shinsuke Harada, Tsukuba (JP); Masanobu Iwaya, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/796,929

(22) Filed: Oct. 30, 2017

(65) Prior Publication Data
US 2018/0138288 A1 May 17, 2018

(30) Foreign Application Priority Data
Nov. 16, 2016 (JP) .................... 2016-223525

(51) Int. Cl.
*H01L 29/66* (2006.01)
*H01L 29/06* (2006.01)
(Continued)

(52) U.S. Cl.
CPC .... *H01L 29/66068* (2013.01); *H01L 21/0262* (2013.01); *H01L 21/02529* (2013.01);
(Continued)

(58) Field of Classification Search
CPC ........... H01L 29/66068; H01L 29/7811; H01L 29/0661
See application file for complete search history.

(56) References Cited

U.S. PATENT DOCUMENTS

| | | |
|---|---|---|
| 5,915,180 A | 6/1999 | Hara et al. |
| 2009/0200559 A1 | 8/2009 | Suzuki et al. |

(Continued)

FOREIGN PATENT DOCUMENTS

| | | |
|---|---|---|
| JP | 3471473 B2 | 12/2003 |
| JP | 2010-147222 A | 7/2010 |
| JP | 2012-195519 A | 10/2012 |

*Primary Examiner* — Lex H Malsawma
*Assistant Examiner* — Laura M Dykes
(74) *Attorney, Agent, or Firm* — Rabin & Berdo, P.C.

(57) ABSTRACT

A silicon carbide semiconductor element includes n-type silicon carbide epitaxial layers formed on an $n^+$-type silicon carbide semiconductor substrate, plural p base layers selectively formed in surfaces of the silicon carbide epitaxial layers, a p-type silicon carbide epitaxial layer formed in the silicon carbide epitaxial layer, and a trench penetrating at least the silicon carbide epitaxial layer. The silicon carbide semiconductor element also includes, in a portion of the silicon carbide epitaxial layer, a mesa portion exposing the p base layer. The silicon carbide semiconductor element further includes, between consecutive mesa side faces of the mesa portion, a flat portion substantially parallel to the silicon carbide substrate. The remaining thickness of the exposed p base layer is larger than 0.5 μm and smaller than 1.0 μm.

8 Claims, 17 Drawing Sheets

(51) Int. Cl.
*H01L 21/02* (2006.01)
*H01L 21/04* (2006.01)
*H01L 29/10* (2006.01)
*H01L 29/78* (2006.01)
*H01L 29/16* (2006.01)
*H01L 21/308* (2006.01)
*H01L 21/3065* (2006.01)
*H01L 29/739* (2006.01)

(52) U.S. Cl.
CPC ...... *H01L 21/0465* (2013.01); *H01L 21/0475* (2013.01); *H01L 21/3065* (2013.01); *H01L 21/3083* (2013.01); *H01L 29/0619* (2013.01); *H01L 29/0623* (2013.01); *H01L 29/0661* (2013.01); *H01L 29/1045* (2013.01); *H01L 29/1095* (2013.01); *H01L 29/1608* (2013.01); *H01L 29/7811* (2013.01); *H01L 29/7813* (2013.01); *H01L 29/0638* (2013.01); *H01L 29/7397* (2013.01)

(56) References Cited

U.S. PATENT DOCUMENTS

| | | | |
|---|---|---|---|
| 2010/0032685 A1* | 2/2010 | Zhang | H01L 29/0615 257/77 |
| 2012/0292636 A1* | 11/2012 | Zhang | H01L 29/0661 257/77 |
| 2014/0145212 A1* | 5/2014 | Takeuchi | H01L 29/66068 257/77 |
| 2015/0115286 A1* | 4/2015 | Takeuchi | H01L 21/8213 257/77 |
| 2015/0311701 A1* | 10/2015 | Kashyap | H02H 9/04 361/111 |
| 2016/0133741 A1* | 5/2016 | Matsuki | H01L 29/7813 257/77 |
| 2018/0151366 A1* | 5/2018 | Endo | H01L 21/265 |

* cited by examiner

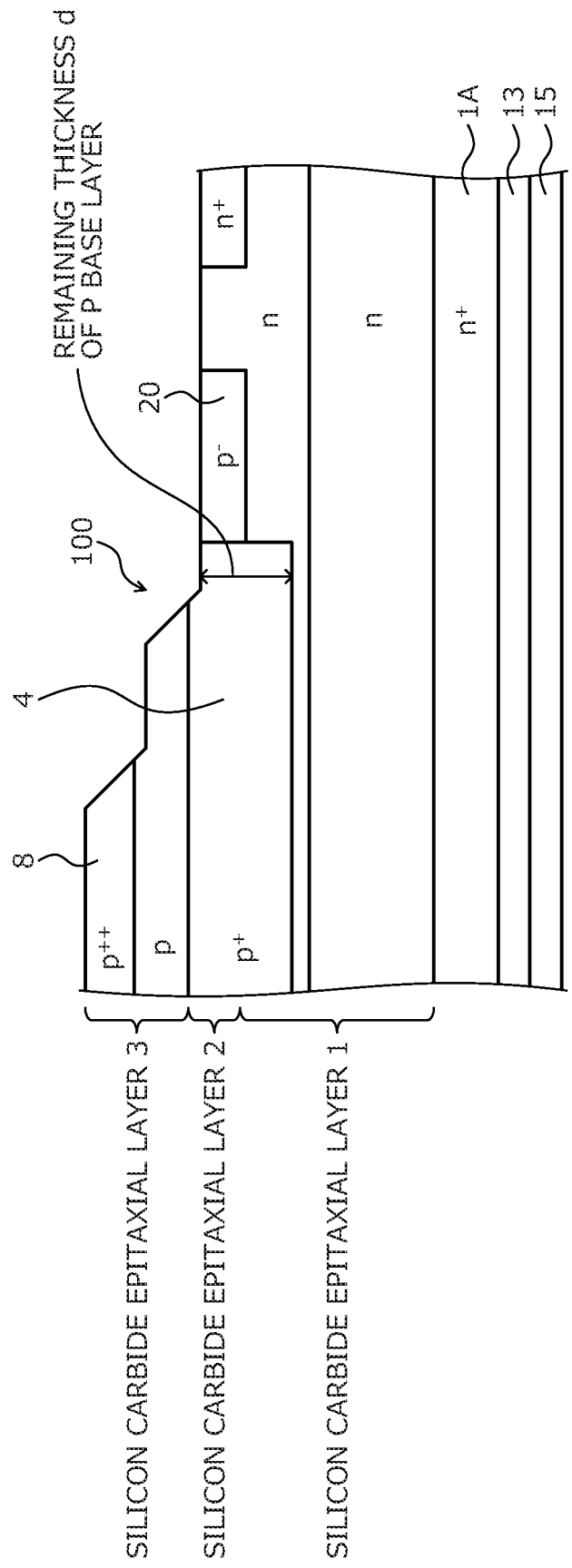

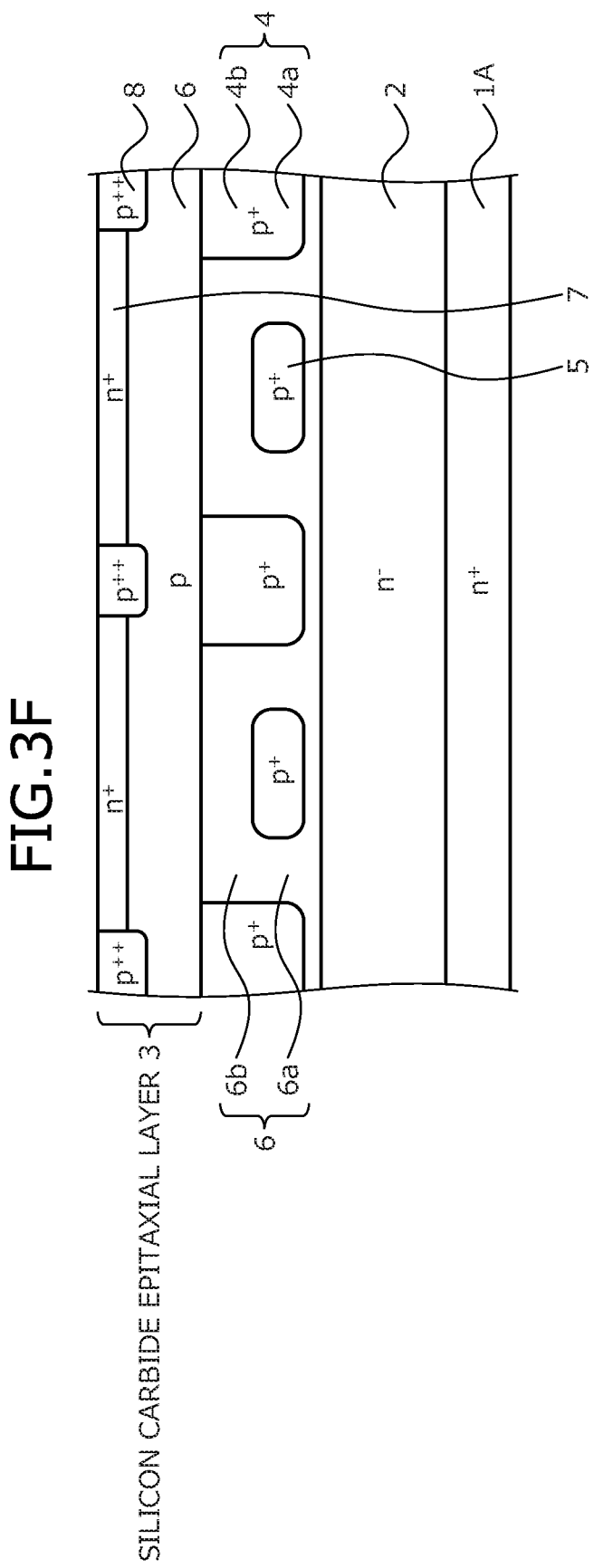

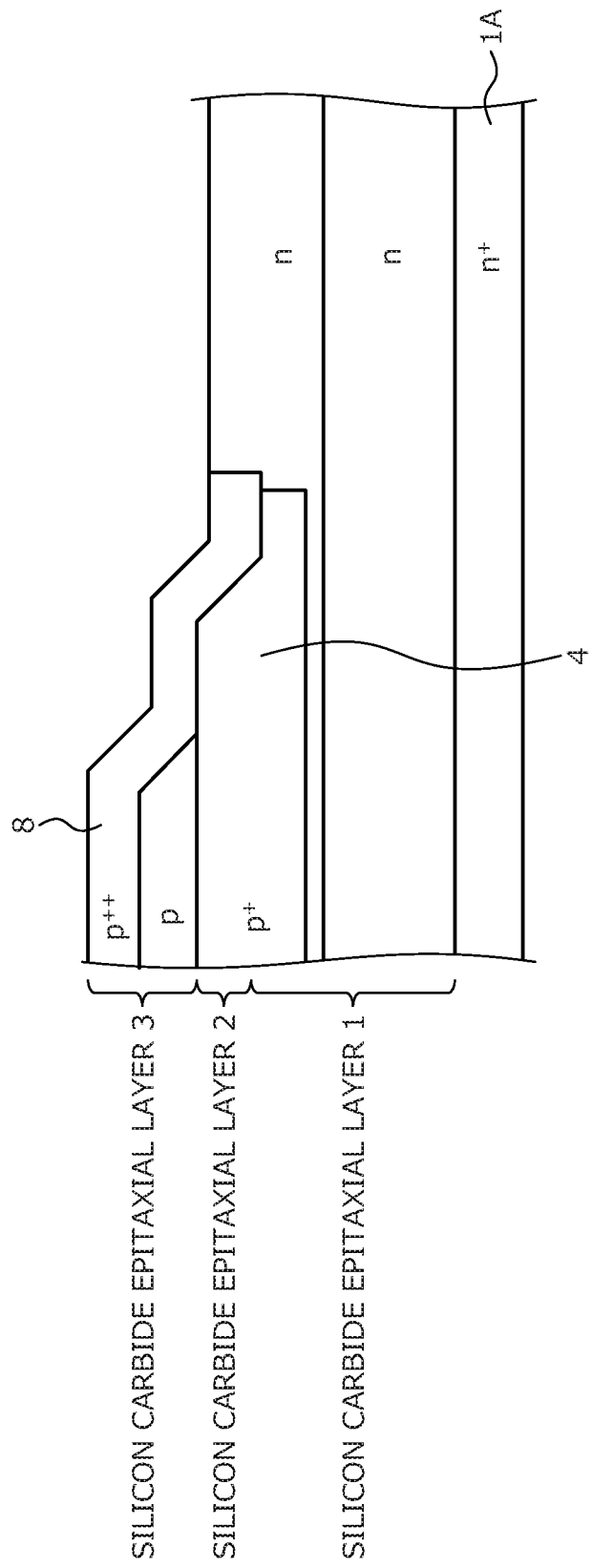

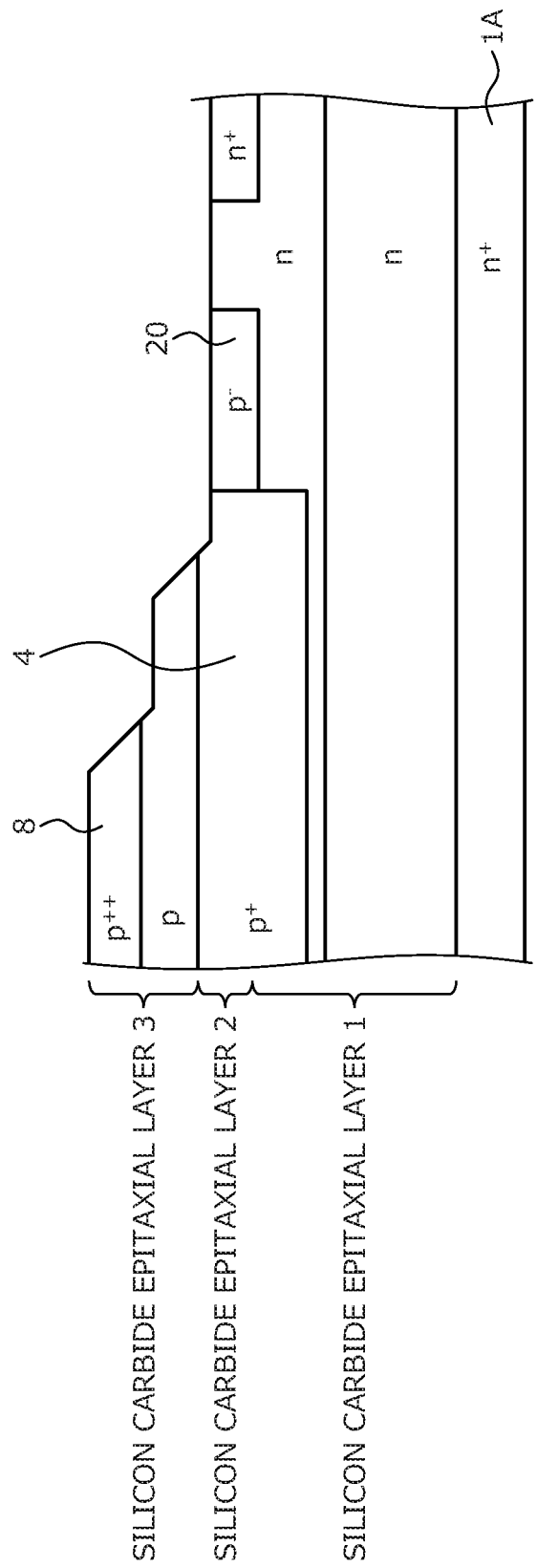

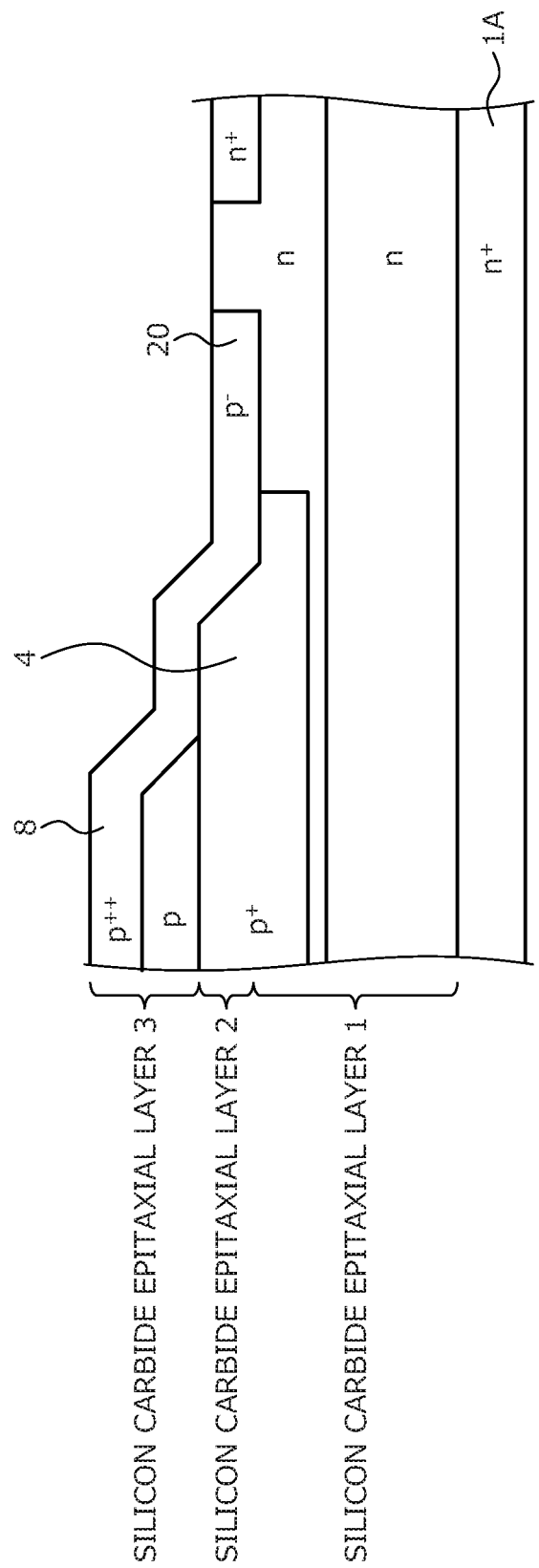

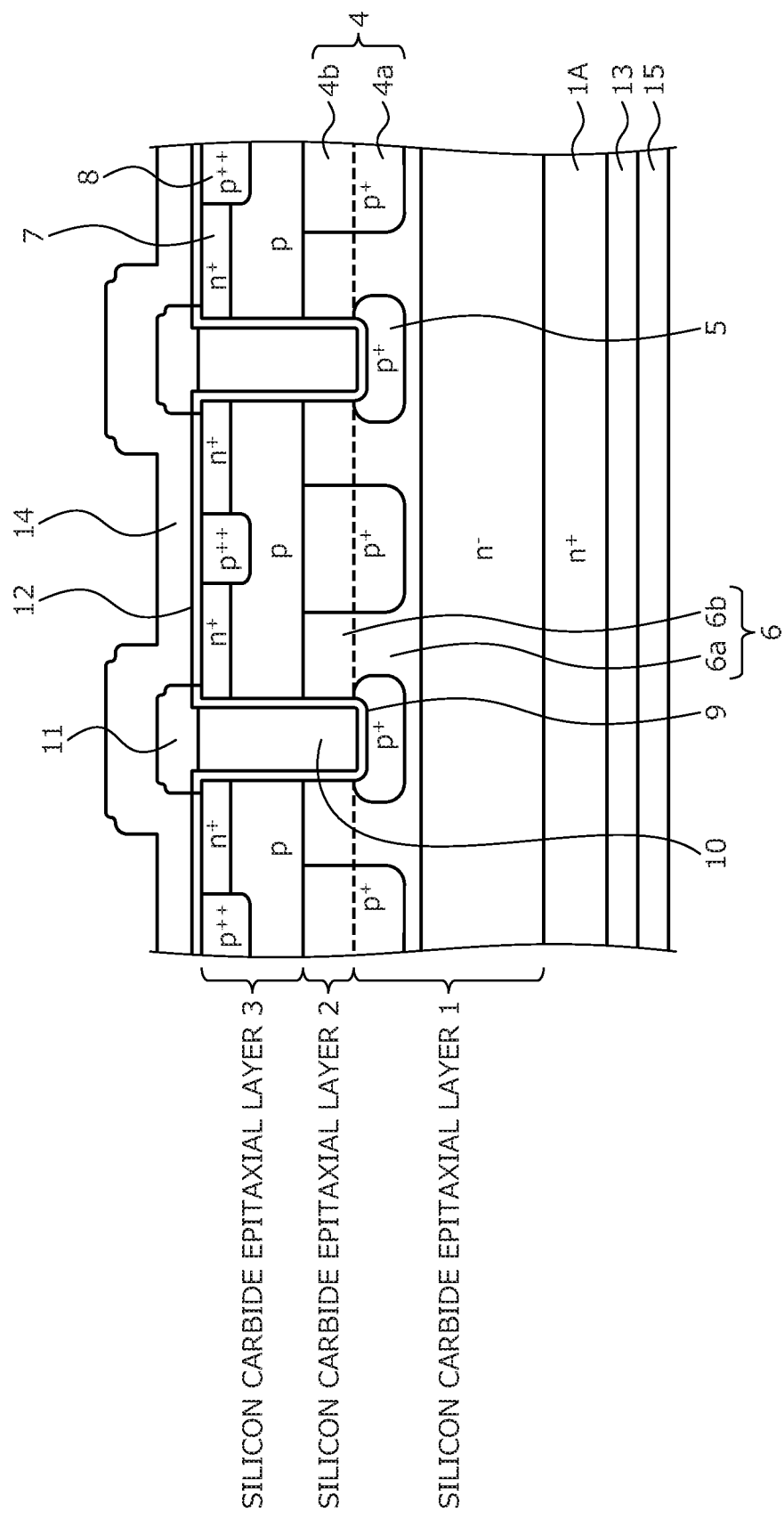

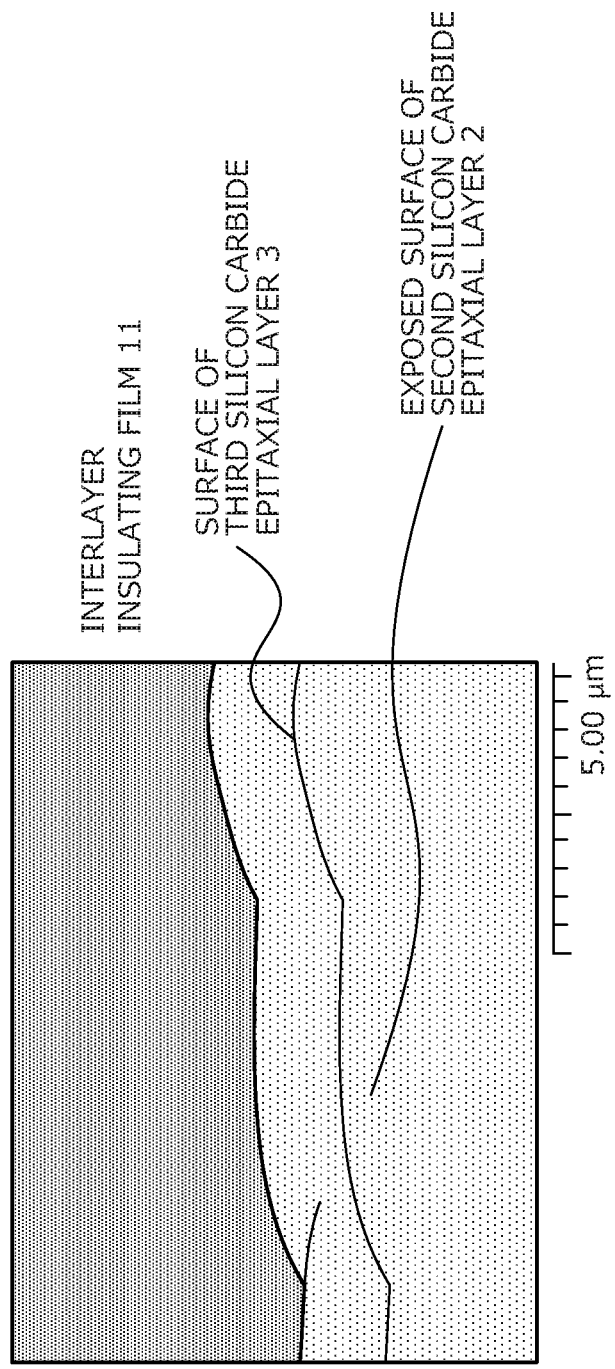

FIG.5

| SAMPLE | AVERAGE VOLTAGE VALUE |
|---|---|
| EXAMPLE 1 | >1330V |
| EXAMPLE 2 | >1330V |
| EXAMPLE 3 | >1330V |
| COMPARATIVE EXAMPLE 1 | 730V |
| COMPARATIVE EXAMPLE 2 | 480V |
| COMPARATIVE EXAMPLE 3 | 430V |

SILICON CARBIDE SEMICONDUCTOR ELEMENT AND METHOD OF MANUFACTURING SILICON CARBIDE SEMICONDUCTOR

CROSS REFERENCE TO RELATED APPLICATIONS

This application is based upon and claims the benefit of priority of the prior Japanese Patent Application No. 2016-223525, filed on Nov. 16, 2016, the entire contents of which are incorporated herein by reference.

BACKGROUND OF THE INVENTION

1. Field of the Invention

Embodiments of the present invention relate to a silicon carbide semiconductor element and a method of manufacturing a silicon carbide semiconductor element.

2. Description of the Related Art

In general, more cells per unit area may be included in a trench-type MOSFET that has a channel substantially perpendicular to the surface of the substrate than in a planar-type MOSFET that has a channel parallel to the surface of the substrate. Therefore, the trench-type MOSFET may increase current density and may easily meet demands for the handling of larger currents.

According to processes disclosed as a method of manufacturing a trench-type silicon carbide MOSFET, plural sessions each including epitaxial growth of silicon carbide and ion implantation are executed and a trench is thereafter formed using a dry etching method (see, e.g., Japanese Patent Publication No. 3471473). With this technique, an n-type silicon carbide epitaxial layer is used as a drift layer, a p-type silicon carbide epitaxial layer is used as a layer functioning as a channel, and an n-type contact region and a p-type body contact region are formed by ion implantation on an upper side of the p-type silicon carbide epitaxial layer. The length of the channel layer is determined by the thickness of the epitaxial layer; and the p-type silicon carbide epitaxial layer is formed having a thickness of about 1.0 µm to 2.0 µm including the contact region on the upper side thereof.

It is known that, to establish breakdown voltage against high voltage, a mesa shape is produced by etching the periphery of the p-type silicon carbide layer formed on the n-type silicon carbide layer, and a termination structure is further produced by implanting p-type ions to establish a low concentration on the n-type silicon carbide layer on an outer periphery of the element exposed by the etching to establish a breakdown voltage structure (see, e.g., Japanese Laid-Open Patent Publication No. 2012-195519).

SUMMARY OF THE INVENTION

According to one embodiment of the invention, a silicon carbide semiconductor element includes a silicon carbide substrate of a first conductivity type; a silicon carbide epitaxial layer of the first conductivity type formed on the silicon carbide substrate; plural base layers of a second conductivity type selectively formed in a surface of the silicon carbide epitaxial layer; a third silicon carbide epitaxial layer of the second conductivity type formed on the silicon carbide epitaxial layer; a trench penetrating at least the third silicon carbide epitaxial layer; and a mesa portion in a region of the third silicon carbide epitaxial layer and exposing the plurality of base layers. A flat portion between consecutive mesa side faces of the mesa portion, the flat portion being substantially parallel to the silicon carbide substrate. A remaining thickness of each base layer of the exposed plural base layers is larger than 0.5 µm and smaller than 1.0 µm.

In the embodiment, the flat portion is formed in a substantially central portion of the third silicon carbide epitaxial layer.

In the embodiment, a low-concentration ion implanted layer of the second conductivity type is provided spanning from an end portion of each of the base layers of the silicon carbide epitaxial layer to an outer side of the element.

In the embodiment, a low-concentration ion implanted layer of the second conductivity type is provided spanning from a mesa side face of the mesa portion to an outer side of the element.

According to another embodiment of the invention, a method of manufacturing a silicon carbide semiconductor element includes forming a first silicon carbide epitaxial layer of a first conductivity type on a silicon carbide substrate of the first conductivity type; selectively forming a first base layer of a second conductivity type in a surface of the first silicon carbide epitaxial layer; forming a second silicon carbide epitaxial layer of the first conductivity type on the first silicon carbide epitaxial layer; forming a second base layer of the second conductivity type selectively continuous with some of a plurality of the first base layer of the first silicon carbide epitaxial layer; forming a third silicon carbide epitaxial layer of the second conductivity type on the second silicon carbide epitaxial layer; removing a periphery of the third silicon carbide epitaxial layer to form a mesa portion having a mesa shape and exposing the first base layer; and forming a trench penetrating at least the third silicon carbide epitaxial layer. The mesa portion is formed by performing dry etching using a photoresist as an etching mask, repeatedly for plural sessions.

In the embodiment, the method includes forming an ion implanted region simultaneously with ion implantation to form a contact region of the second conductivity type continuous from an upper surface of the third silicon carbide epitaxial layer to a mesa side face of the mesa portion.

In the embodiment, the method includes forming an ion implanted region simultaneously with ion implantation to form a breakdown voltage structure region of the second conductivity type continuous from an upper face of the second silicon carbide epitaxial layer to a mesa side face of the mesa portion.

In the embodiment, the method includes forming an end portion of an ion implanted region to be farther inward than an element region surrounded by a flat portion between consecutive mesa side faces of the mesa portion, the end portion of an ion implanted region being formed simultaneously with ion implantation to form a contact region of the second conductivity type having a shape continuous from an upper face of the third silicon carbide epitaxial layer to a mesa side face of the mesa portion.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 2 is a cross-sectional diagram of an end portion region of the silicon carbide semiconductor element according to the embodiment;

FIGS. 3A, 3B, 3C, 3D, 3E, 3F, 3G, 3H, 3I, 3J, 3K, 3L, and 3M are cross-sectional diagrams of the semiconductor element according to the embodiment during manufacture;

FIG. 4 is an enlarged diagram of image data showing a mesa shape of Example 1; and FIG. 5 is a table of leak generation in Examples 1 to 3 and Comparative Examples 1 to 3.

DETAILED DESCRIPTION OF THE INVENTION

Figure 1:
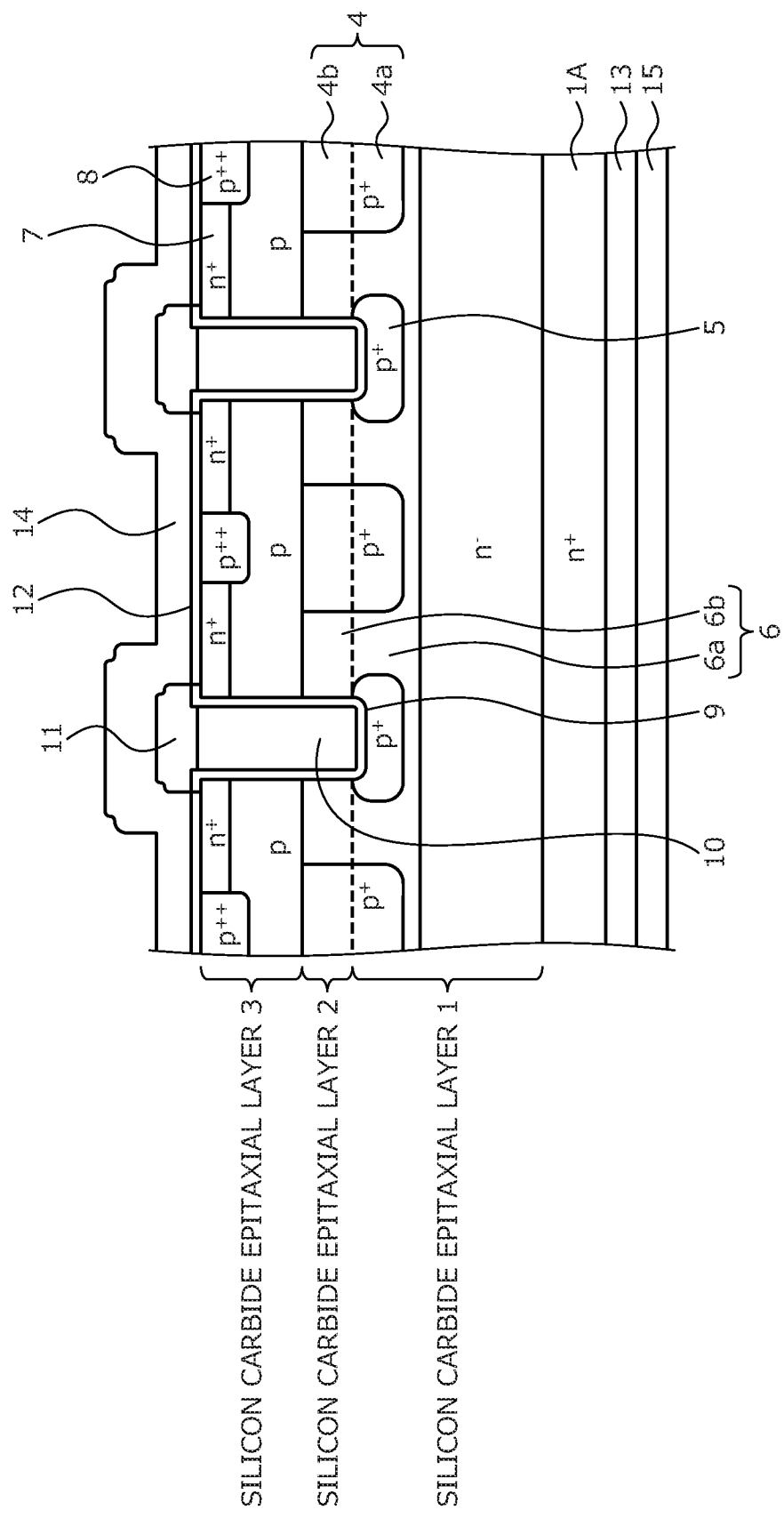
FIG. 1 is a cross-sectional diagram of a structure of an active region of a silicon carbide semiconductor element according to an embodiment.

Conventionally, when dry etching is performed for a silicon carbide epitaxial layer having a film thickness equal to or larger than 1.0 μm, silicon oxide is generally used as the mask material taking into consideration the selection ratios of the etching mask and the portion of the silicon carbide to be etched. A mesa side face may have a taper angle equal to or smaller than 45 degrees to suppress concentration of the electric field, and special techniques to produce a mesa shape are necessary such as imparting a taper angle also to the mask material. In particular, at a process of removing a silicon carbide epitaxial layer by dry etching, a problem arises in that end portions of the region to be etched are etched deeper than the surroundings thereof, i.e., a so-called sub-trench is formed because the etching gas concentrates at these positions. The sub-trench tends to be deeper as the silicon carbide epitaxial layer to be removed becomes thicker, and is a factor that causes the generation of leak current during voltage application.

The silicon carbide epitaxial layer has to be ground by the depth larger than the maximal thickness thereof because the process of removing the silicon carbide epitaxial layer is affected by variations in the thickness of the silicon carbide epitaxial layer itself and variation in the etching depth. Therefore, the thickness of the exposed silicon carbide epitaxial layer on the lower side tends to be reduced. In this regard, to cause a p-type base layer formed in a lower portion of a p-type silicon carbide epitaxial layer to remain to have a thickness of 0.6 μm to 1.0 μm after removal of the 2.0-μm p-type silicon carbide epitaxial layer such as in the case of a silicon carbide semiconductor element described in, for example, Japanese Laid-Open Patent Publication No. 2010-147222, the p-type base layer has to be formed to have a thickness larger than at least 1.0 μm. To realize this, ions such as aluminum (Al) have to be implanted into the drift layer including silicon carbide by energy higher than usual, and crystal defects are generated. A problem therefore arises in that the reliability is degraded such as an increase of leak current.

As described, the process of removing the silicon carbide epitaxial layer of 1.0 μm or thicker is a factor causing the generation of the leak current during application of reverse voltage to the silicon carbide semiconductor element and therefore, places limitations on important parameters of the trench-type silicon carbide MOSFET element such as the channel length, the trench depth, etc. determined by the thickness of the p-type silicon carbide epitaxial layer. Therefore, the reliability of the element cannot be improved.

Embodiments of the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index. Herein, description is given assuming a first conductivity type to be an n-type and a second conductivity type to be a p-type.

FIG. 1 is a cross-sectional diagram of a structure of an active region of a silicon carbide semiconductor element according to the embodiment. FIG. 1 depicts the active region in which a current path is formed when positive voltage is applied to the silicon carbide semiconductor element. FIG. 2 is a cross-sectional diagram of an end portion region of the silicon carbide semiconductor element according to the embodiment. As depicted in FIGS. 1 and 2, the silicon carbide semiconductor element according to the embodiment includes an n-type first silicon carbide epitaxial layer 1 deposited on a first main surface, for example, a (0001) surface (an Si surface) of an n$^+$-type silicon carbide substrate 1A.

The n$^+$-type silicon carbide substrate 1A is a silicon carbide, single crystal substrate doped with an n-type impurity such as nitrogen. The first silicon carbide epitaxial layer 1 is a low-concentration n-type drift layer doped with an n-type impurity such as nitrogen and has an impurity concentration lower than that of the n$^+$-type silicon carbide semiconductor substrate 1. The thickness of the first silicon carbide epitaxial layer differs according to the breakdown voltage of the element and a thickness of about 3 μm to about 100 μm is used.

A p-type ion implanted layer (a p$^+$ base layer) 4a constituting a lower layer of the p base layer 4 and a p-type ion implanted layer (a p$^+$ base layer) 5 positioned at a bottom portion of the trench are formed in a first main surface of the first silicon carbide epitaxial layer 1 (a first surface of the first silicon carbide epitaxial layer 1 opposite a second surface facing the silicon carbide substrate 1A). The ion implantation depth of each of the p base layers 4a and 5 may be about 0.7 μm at maximum whereby crystal defects may be recovered by heat treatment. An n-type ion implanted layer 6a having an impurity concentration lower than that of the n$^+$-type silicon carbide substrate 1A and higher than that of the first silicon carbide epitaxial layer 1 may be formed in a region forming a current path along peripheries of the p base layers 4a and 5.

A second silicon carbide epitaxial layer 2 is formed on the first main surface of the first silicon carbide epitaxial layer 1 (the first surface of the first silicon carbide epitaxial layer 1 opposite the second surface facing the silicon carbide substrate 1A). The second silicon carbide epitaxial layer 2 is a low concentration n-type drift layer doped with an n-type impurity such as nitrogen and has an impurity concentration equal to that of the first silicon carbide semiconductor substrate 1. The thickness of the second silicon carbide epitaxial layer may be a thickness sufficient for a current path, and a thickness of about 0.3 μm to about 0.7 μm is used.

A p base layer 4b is formed in a first main surface of the second silicon carbide epitaxial layer 2 (a first surface of the second silicon carbide epitaxial layer 2 opposite a second surface facing toward the silicon carbide substrate 1A), in a region continuous with the p base layer 4a formed in the first silicon carbide epitaxial layer 1. A region formed by the p base layer 4a and the p base layer 4b will be referred to as "p base layer 4".

An n-type ion implanted layer 6b having an impurity concentration lower than that of the $n^+$-type silicon carbide substrate 1A and higher than that of the first silicon carbide epitaxial layer 1 may be formed in a region that forms the current path along the periphery of the p base layer 4 and that is positioned so that the n-type ion implanted layer 6b is joined with the n-type ion implanted layer 6a that is formed in the first silicon carbide epitaxial layer 1. The region formed by the n-type ion implanted layer 6a and the n-type ion implanted layer 6b will be referred to as "n-type ion implanted layer 6".

A third silicon carbide epitaxial layer 3 is formed on the first main surface of the second silicon carbide epitaxial layer 2 (the first surface of the second silicon carbide epitaxial layer 2 opposite the second surface facing toward the silicon carbide substrate 1A). The third silicon carbide epitaxial layer 3 is a p-type layer doped with, for example, aluminum (Al) and functions as a channel of the trench-type MOSFET.

As depicted in FIG. 2, a periphery of the third silicon carbide epitaxial layer 3 is removed and the third silicon carbide epitaxial layer 3 includes a mesa portion 100 where the second silicon carbide epitaxial layer 2 is exposed. A bottom portion of a side face of the mesa portion 100 contacts the p base layer 4 that is formed in the surface of the second silicon carbide epitaxial layer 2 by ion implantation, and a thickness of the exposed p base layer 4 is greater than 0.5 μm.

As described, although a technique of performing ion implantation using higher energy and a technique of forming the p base layer 4 by epitaxial growth may be considered as methods of forming the p base layer to have a remaining thickness d that is larger than 0.5 μm at the bottom portion of the side face of the mesa portion 100, problems arise from these techniques such as the formation of crystal defects and an increase in the process steps. A low-concentration p-type ion implanted layer 20 is provided in a periphery of the p base layer 4. The mesa portion 100 and the low concentration p-type ion implanted layer 20 form a termination region that maintains the breakdown voltage of the element.

The side face of the mesa portion 100 has a shape including portions whose angles α with respect to a main surface of the silicon carbide substrate 1A are each an acute angle and portions that are substantially parallel to the main surface of the silicon carbide substrate 1A, alternately arranged. This shape is formed by dividing and performing the removal of the third silicon carbide epitaxial layer 3 in plural sessions, and has features such as a lower likelihood that sub-trenches will be generated at the border between an etched portion and a non-etched portion, and accurate control of the etching depth. The angles α of the side face of the mesa portion 100 with respect to the surface of the silicon carbide substrate 1A are selected from among angles that are less than about 45 degrees and that do not affect the element dimensions; and may be in a range of 10 to 30 degrees. The depth of the mesa portion 100 may be greater than the thickness of the third silicon carbide epitaxial layer 3, is determined so as to be in a range whereby the second silicon carbide epitaxial layer 2 exposed by etching is not excessively ground, and is controlled to be a depth whereby the remaining thickness d of the p base layer 4 is greater than 0.5 μm.

The position of a region of the side face of the mesa portion 100 substantially parallel to the main surface of the silicon carbide substrate 1A may be arbitrarily determined and, for example, as depicted in FIG. 2, a substantial center of the third silicon carbide epitaxial layer 3, a lower portion of the p-type layer into which ion implantation is executed from the surface, or the like may be selected. In this manner, an effect is achieved in that the length of the element end face may be increased to improve the breakdown voltage since a flat portion substantially parallel to the silicon carbide substrate 1A is included between the consecutive mesa side faces.

A trench is formed in the third silicon carbide epitaxial layer 3. The trench is formed to penetrate at least the third silicon carbide epitaxial layer from a first main surface of the third silicon carbide epitaxial layer 3. The bottom portion of the trench contacts the p base layer 5 formed in the first silicon carbide epitaxial layer or is positioned near the p base layer 5. Along a surface of the trench, a gate insulating film 9 is formed on the bottom portion and a side portion of the trench. A gate electrode 10 insulated from the surroundings by the gate insulating film 9 is provided in the trench. A portion of the gate electrode 10 may protrude externally from the trench.

An $n^+$ source region 7 and a $p^{++}$ contact region 8 are provided in the first main surface of the third silicon carbide epitaxial layer 3. The $n^+$ source region 7 and the $p^{++}$ contact region 8 contact each other. An interlayer insulating film 11 is provided on a first main surface of the silicon carbide semiconductor substrate entirely so as to cover the gate electrode 10 embedded in the trench. A source electrode 12 contacts the $n^+$ source region 7 and the $p^{++}$ contact region 8 through a contact hole opened in the interlayer insulating film 11. The source electrode 12 is electrically insulated from the gate electrode by the interlayer insulating film 11. An electrode pad 14 is provided on the source electrode 12.

A drain electrode 13 and a drain electrode pad 15 are provided on a second main surface of the $n^+$-type silicon carbide substrate 1A (the surface of the $n^+$-type silicon carbide substrate 1A opposite the first main surface on which the first silicon carbide epitaxial layer 1 is formed).

FIGS. 3A, 3B, 3C, 3D, 3E, 3F, 3G, 3H, 3I, 3J, 3K, 3L, and 3M are cross-sectional diagrams of the semiconductor element according to the embodiment during manufacture. The manufacturing processes of the trench-type MOSFET will sequentially be described below.

Figure 3A:
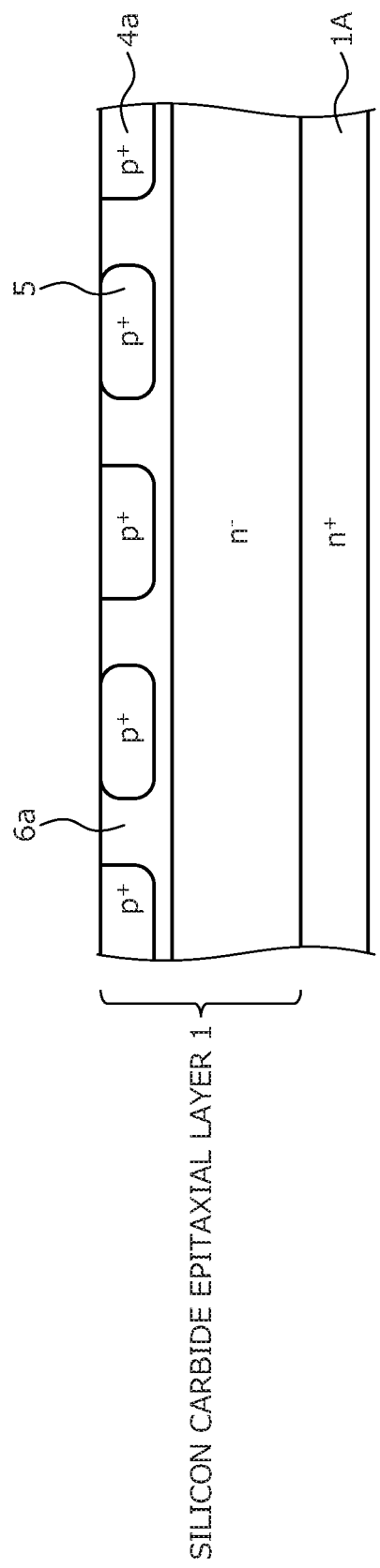

As depicted in FIG. 3A, the first silicon carbide epitaxial layer 1 doped with an n-type impurity such as nitrogen is formed to have a thickness of, for example, 10 μm on the first main surface of the $n^+$-type silicon carbide substrate 1A. The impurity concentration of the first silicon carbide epitaxial layer 1 may be set to be about $3\times10^{15}/cm^3$.

A silicon oxide film having a thickness of 1.5 μm is deposited on the surface of the first silicon carbide epitaxial layer 1 using a method such as plasma CVD, and a mask including a predetermined opening for ion implantation is formed by photolithography. A p-type impurity such as aluminum is implanted into the opening of the silicon oxide film to form the p base layer 4a at a depth of about 0.5 μm. The p base layer 5 forming the bottom portion of the trench may be formed simultaneously with the p base layer 4a. The impurity concentrations of the p base layer 4a and the p base layer 5 are each set to be, for example, about $5\times10^{18}/cm^3$.

A portion of the mask for the ion implantation is removed and an n-type impurity such as nitrogen is ion implanted into the opening to form a high-concentration n-type region (the n-type ion implanted layer 6a) at a depth of, for example, about 0.5 μm in a portion of the surface region of the first silicon carbide epitaxial layer 1. The impurity concentration of the n-type ion implanted layer 6a is set to be, for example, about $1.0 \times 10^{17}/cm^3$.

Figure 3B:
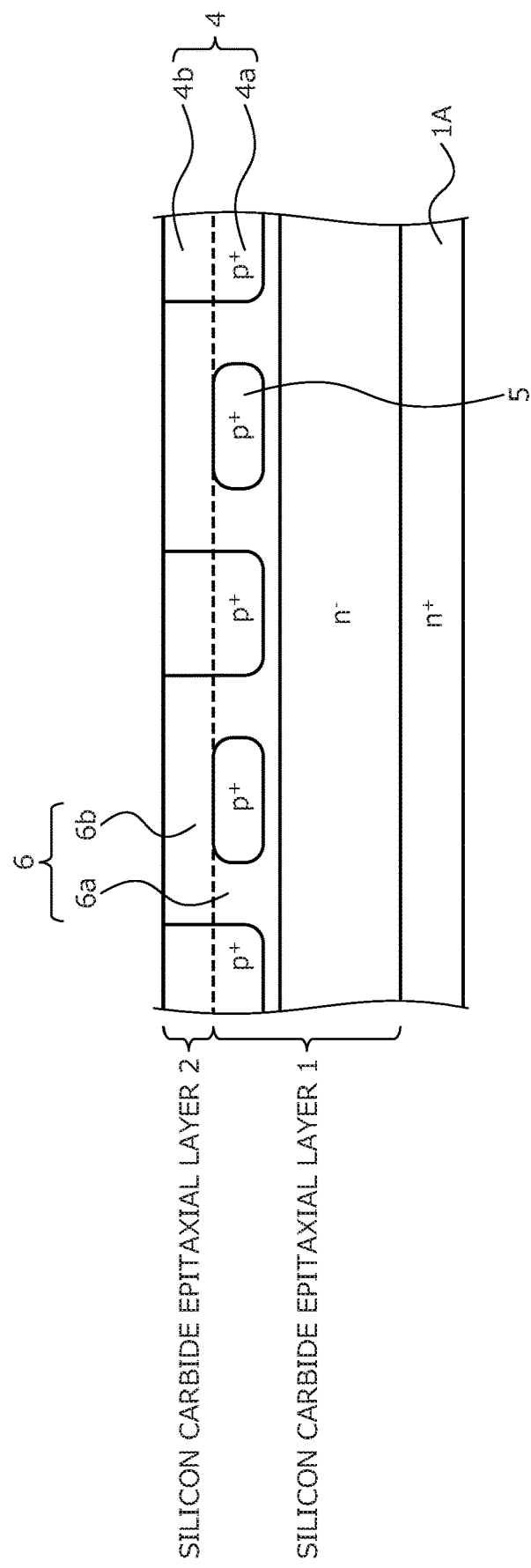

As depicted in FIG. 3B, the second silicon carbide epitaxial layer 2 doped with an n-type impurity such as nitrogen is formed on the surface of the first silicon carbide epitaxial layer 1 to have a thickness of about 0.5 μm. The impurity concentration of the second silicon carbide epitaxial layer 2 is set to be about $3 \times 10^{15}/cm^3$. A silicon oxide film having a thickness of 1.5 μm is deposited on the surface of the second silicon carbide epitaxial layer 2 using a method such as plasma CVD, and a mask including a predetermined opening for ion implantation is formed by photolithography. A p-type impurity such as aluminum is implanted into the opening of the silicon oxide film to form the p base layer 4b at a depth of about 0.5 μm to overlap the p base layer 4a. The p base layers 4a and 4b form a continuous region forming the p base layer 4. The impurity concentration of the p base layer 4b is set to be, for example, about $5 \times 10^{18}/cm^3$.

A portion of the mask for the ion implantation is removed and an n-type impurity such as nitrogen is ion-implanted into the opening to form the n-type ion implanted layer 6b at a depth of, for example, about 0.5 μm in a portion of the surface region of the second silicon carbide epitaxial layer 2. The impurity concentration of the n-type ion implanted layer 6b is set to be, for example, about $1 \times 10^{17}/cm^3$. At least a portion of the n-type region 6b and a portion pf the n-type region 6a contact each other to form an n-type region (the n-type ion implanted layer 6).

Figure 3C:
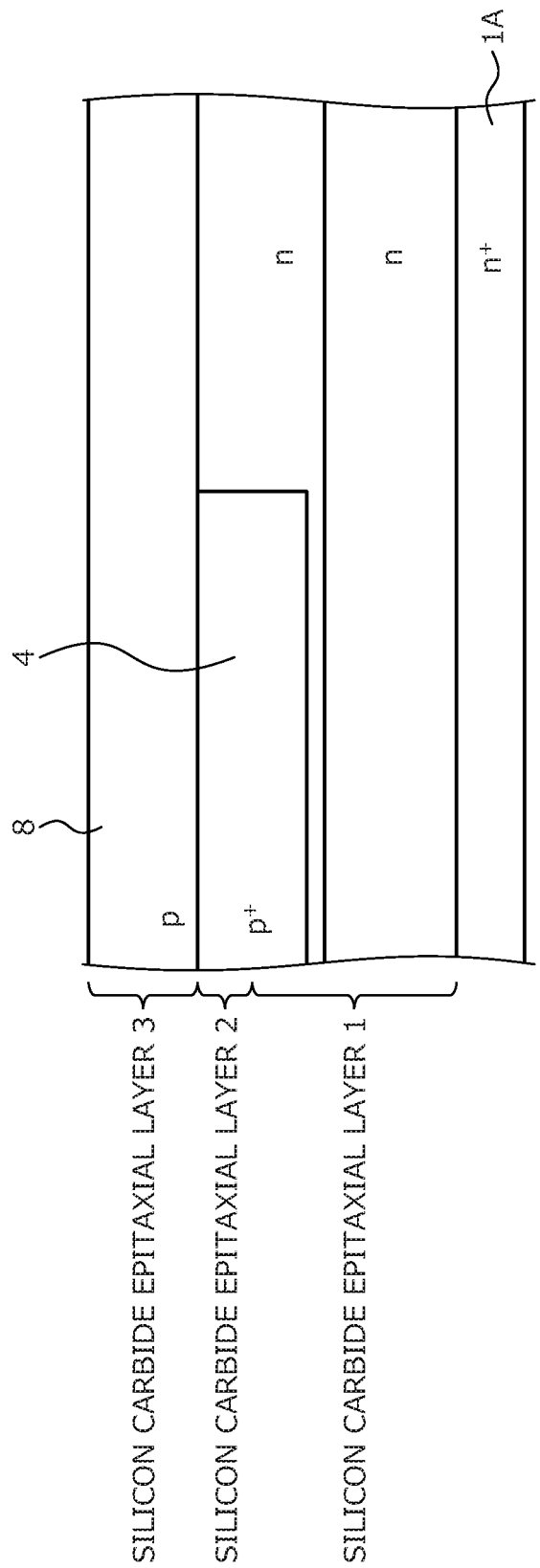

As depicted in FIG. 3C, the third silicon carbide epitaxial layer 3 doped with a p-type impurity such as aluminum is formed to have a thickness of about 1.3 μm on the surface of the second silicon carbide epitaxial layer 2. FIG. 3C depicts the end portion region of the silicon carbide semiconductor element. The impurity concentration of the third silicon carbide epitaxial layer 3 is set to be about $4 \times 10^{17}/cm^3$.

Figure 3D:
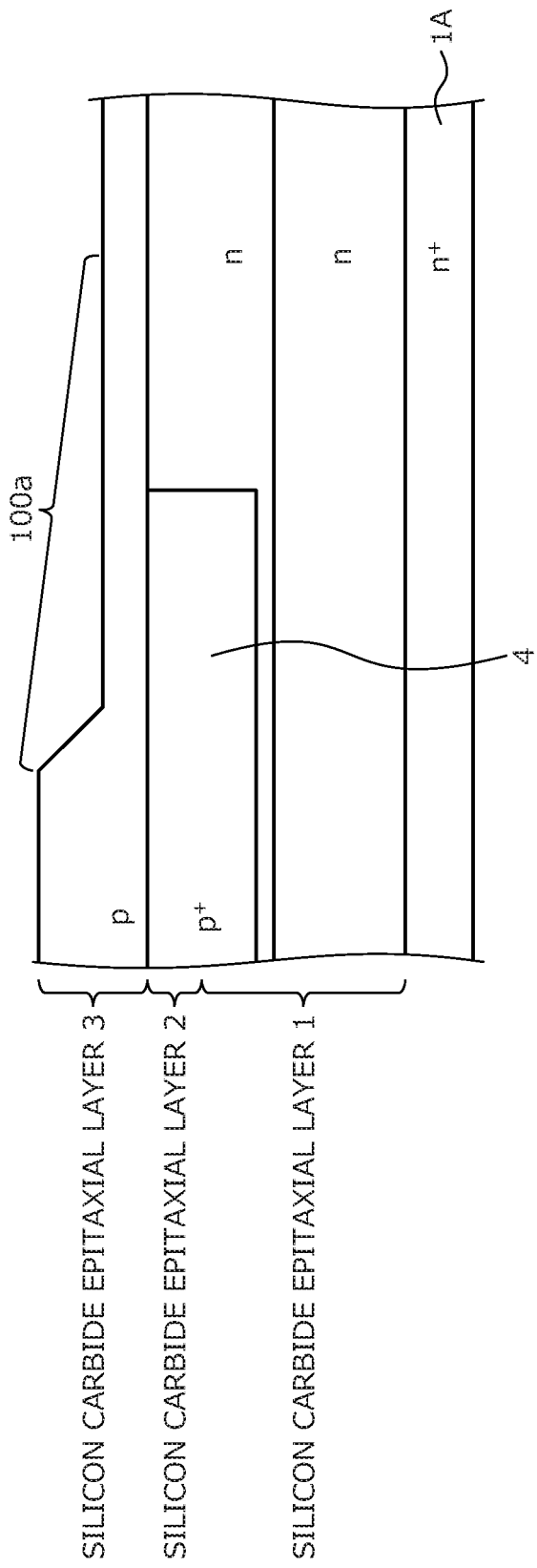

As depicted in FIG. 3D, a photoresist is formed in the central portion of the element on the third silicon carbide epitaxial layer 3 by photolithography and, using this photoresist as a mask, dry etching is performed using a fluorine-based gas such as $SF_6$ to remove the periphery of the third silicon carbide epitaxial layer 3 to a depth of about 0.7 μm to produce a first step mesa 100a of the mesa portion 100.

Figure 3E:
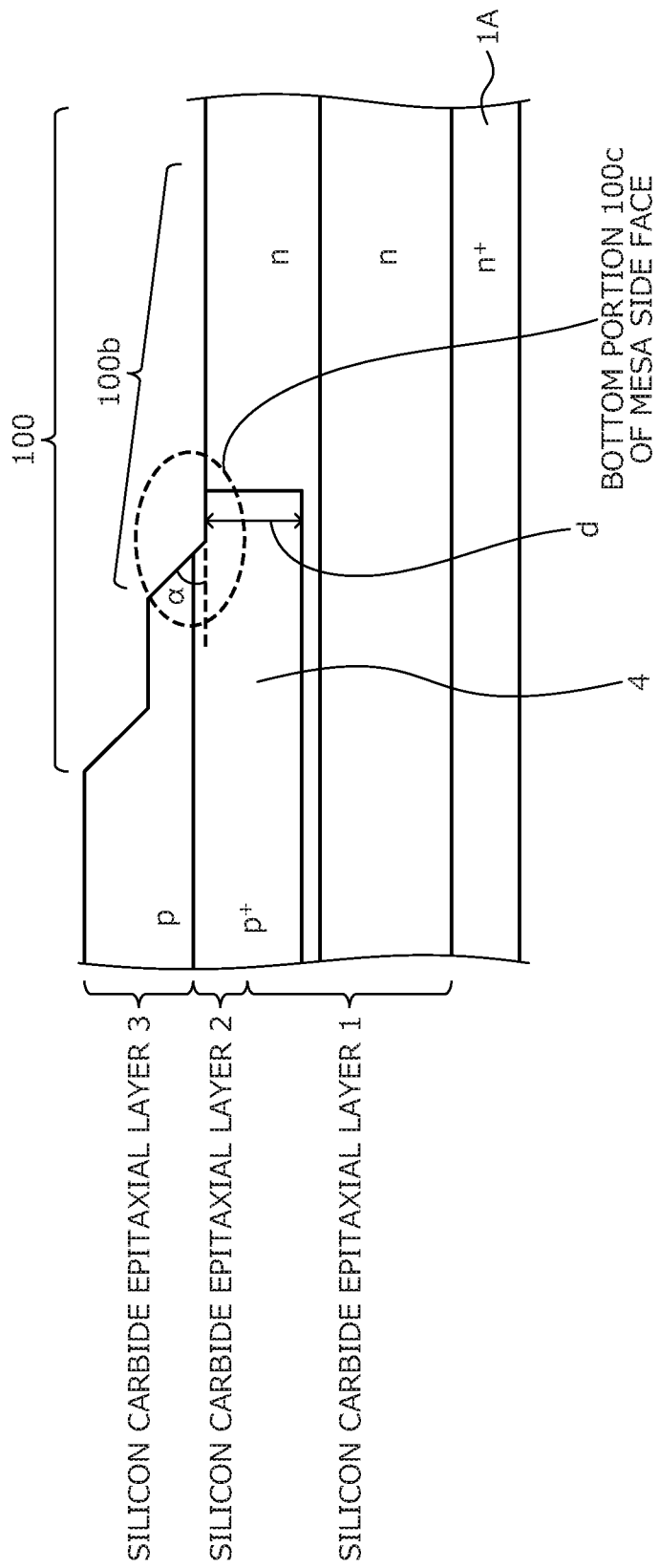

As depicted in FIG. 3E, a photoresist is formed in a region larger than the first step mesa 100a by photolithography and dry etching is performed to remove the periphery of the third silicon carbide epitaxial layer 3 to the depth of about 0.7 μm to produce a second step mesa 100b.

The mesa portion 100 is thereby produced to have a total depth of 1.4 μm and the second silicon carbide epitaxial layer 2 is exposed at the periphery of the third silicon carbide epitaxial layer 3. As depicted in FIG. 3E, a bottom portion 100c of the mesa side face of the mesa portion 100 contacts the p base layer 4 formed in the second silicon carbide epitaxial layer 2, and a face substantially parallel to the silicon carbide substrate 1A is formed in the center of the mesa side face.

The mesa portion 100 may be produced by two or more dry etching sessions, and the silicon carbide semiconductor element including a milder mesa side face may be produced as the number of sessions is increased. Every time the etching is executed, a technique of alleviating the distribution of the depth by the etching may be employed such as changing the orientation of the wafer. On the other hand, since the number of process steps disadvantageously increases, the mesa shape may be formed by two etching sessions, which is equal to that of the dry etching that uses the silicon carbide as an etching mask.

There is a method of forming a taper in the photoresist to control the angle α formed by the mesa side face of the mesa portion 100 and the silicon carbide substrate 1A to be a predetermined angle, for example, 10 to 30 degrees. For example, the surface of the photoresist is contracted by setting the temperature of post-baking after the development of the photoresist to be about 120 degrees C. to about 150 degrees C. whereby the taper may be formed. The taper may also be formed in the photoresist by forming a slit in the end portion of the exposure photomask to perform partial exposure.

Because the removal of the third silicon carbide epitaxial layer 3 is executed divided into the plural sessions using exposure photomasks, the border between the etched portion and the non-etched portion may be shifted whereby an effect is achieved in that sub-trenches that tend to be generated at a position of the border are suppressed. The depth of the mesa portion 100 may be larger than the thickness of the third silicon carbide epitaxial layer 3 and is determined so as to be in a range whereby the second silicon carbide epitaxial layer 2 exposed by the etching is not excessively ground and, for example, with a condition that the remaining thickness d of the p base layer 4 is to be larger than 0.5 μm, the mesa depth of the mesa portion 100 is controlled to be in a range larger than 1.3 μm and smaller than 1.8 μm.

As depicted in FIG. 3F, in the active region portion, a silicon oxide film having a thickness of 1.5 μm is deposited on the surface of the third silicon carbide epitaxial layer 3 and the exposed second silicon carbide epitaxial layer 2 using a method such as plasma CVD, and a mask including a predetermined opening for ion implantation is formed by photolithography. An n-type impurity such as phosphorus is ion implanted into the opening to form the $n^+$ source region 7 in a portion of the surface of the third silicon carbide epitaxial layer 3. The impurity concentration of the $n^+$ source region 7 is set to be higher than the impurity concentration of the third silicon carbide epitaxial layer 3.

The mask for the ion implantation used in the formation of the $n^+$ source region 7 is removed, and a mask including a predetermined opening for ion implantation is formed using the same method. A p-type impurity such as aluminum is ion-implanted into a portion of the surface of the third silicon carbide epitaxial layer 3 to form the $p^{++}$ contact region 8. The impurity concentration of the $p^{++}$ contact region 8 is set to be higher than the impurity concentration of the third silicon carbide epitaxial layer 3.

Figure 3G:
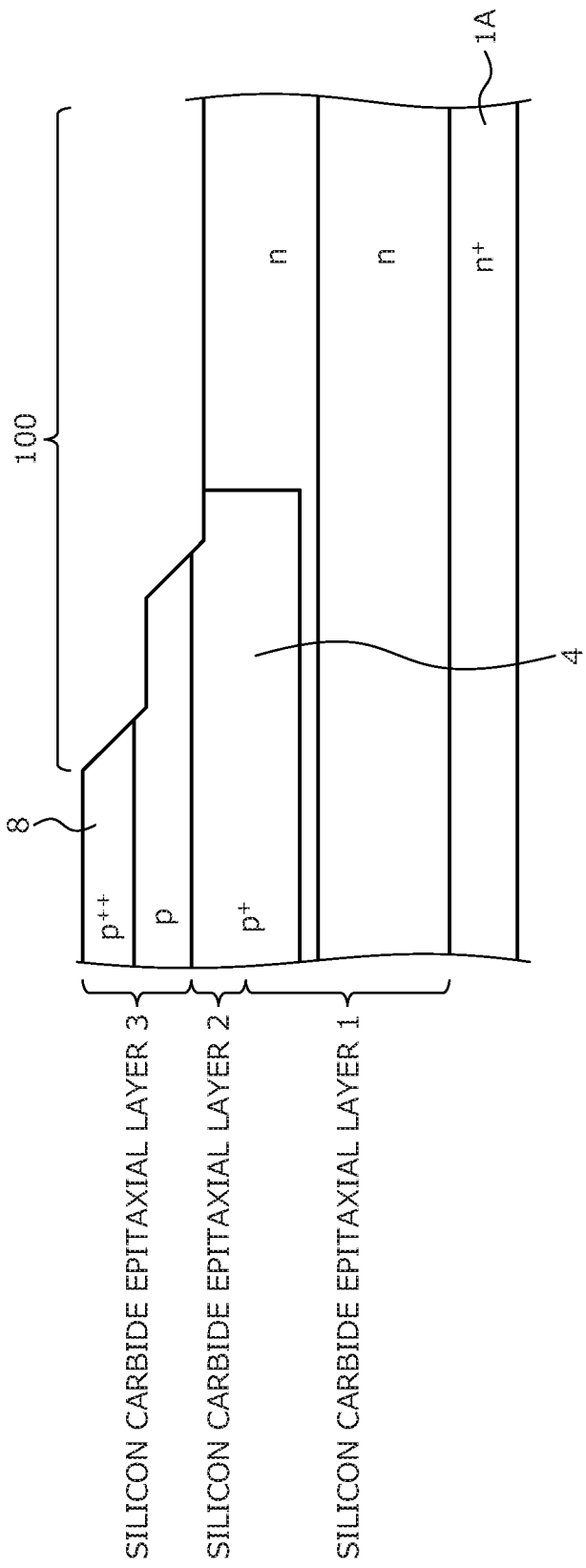

As depicted in FIG. 3G, a region ion-implanted simultaneously with the formation of the $p^{++}$ contact region 8 is formed spanning from an outer side of the active region to a region on an inner side of the mesa portion 100. At this time, a portion substantially parallel to the silicon carbide substrate 1A of the mesa side face of the mesa portion 100 is set to be outside the $p^{++}$ contact region 8 and the exposed length of the third silicon carbide epitaxial layer 3 may be increased.

As depicted in FIG. 3H, the region ion-implanted simultaneously with the formation of the $p^{++}$ contact region 8 may cover the p base layer 4 and may extend from a position on the active region to a position on the surface of the second silicon carbide epitaxial layer 2.

After the process depicted in FIG. 3G or FIG. 3H, a silicon oxide film having a thickness of 1.5 μm is deposited on the surfaces of the third silicon carbide epitaxial layer 3 and the exposed second silicon carbide epitaxial layer 2 using a method such as plasma CVD, and a mask including a predetermined opening for ion implantation is formed by photolithography.

As depicted in FIG. 3I, a p-type impurity such as aluminum is ion-implanted in the opening to form in the surface of the exposed second silicon carbide epitaxial layer 2, the termination region 20 having a low impurity concentration. The termination region 20 may have a structure configured to be formed in a region spanning from the end portion of the p base layer 4 to the outer side of the element or, as depicted in FIG. 3J, a structure formed spanning from the mesa side face of the mesa portion 100 toward the outer side of the element.

After the process depicted in FIG. 3I or FIG. 3J, heat treatment is performed in an inert gas atmosphere at about 1700 degrees C. to activate the first p base layer, the second p base layer, the source region, and the $p^{++}$ contact region. Thereafter, a silicon oxide film having a thickness of 1.5 μm is deposited on the surfaces of the third silicon carbide epitaxial layer 3 and the exposed second silicon carbide epitaxial layer 2 using a method such as plasma CVD, and a mask including a predetermined opening for forming the trench is produced by photolithography.

Figure 3K:
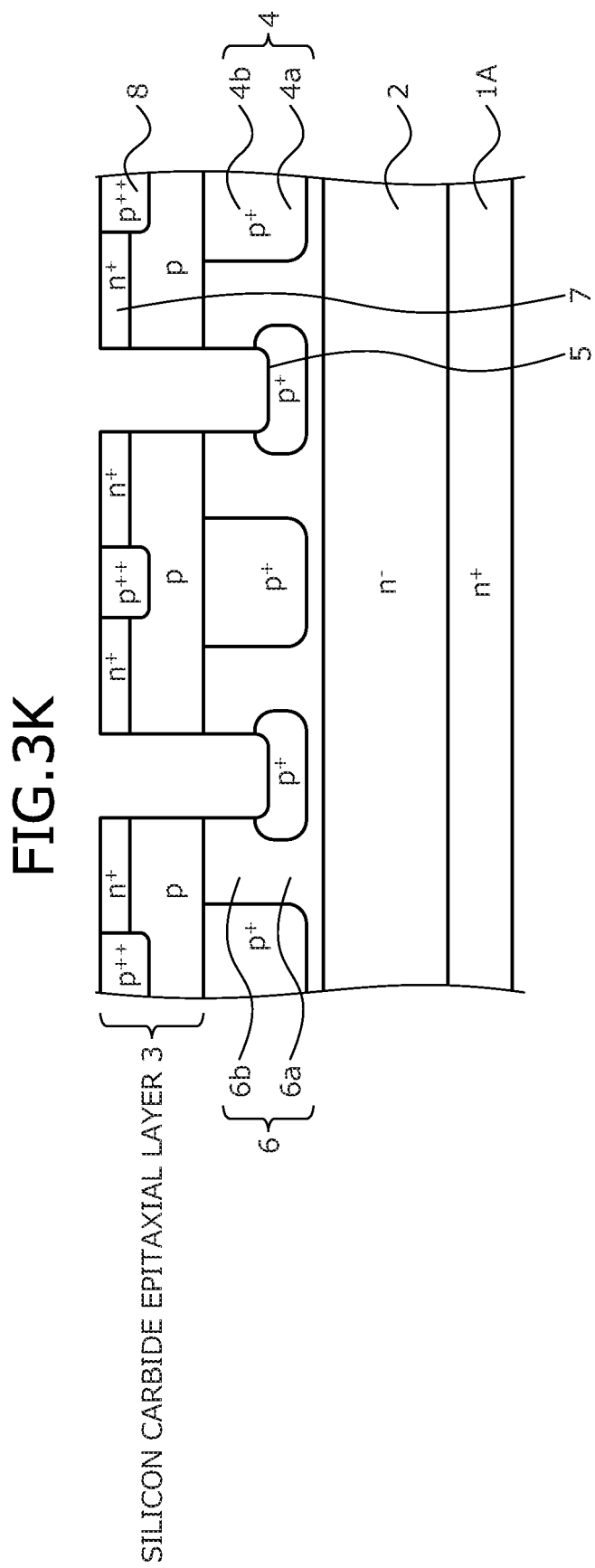

As depicted in FIG. 3K, the trench penetrating the third silicon carbide epitaxial layer 3 to reach the second silicon carbide epitaxial layer 2 is formed by dry etching. The bottom portion of the trench may reach the p base layer 4 that is formed in the first silicon carbide epitaxial layer. The mask for forming the trench is removed.

Figure 3L:
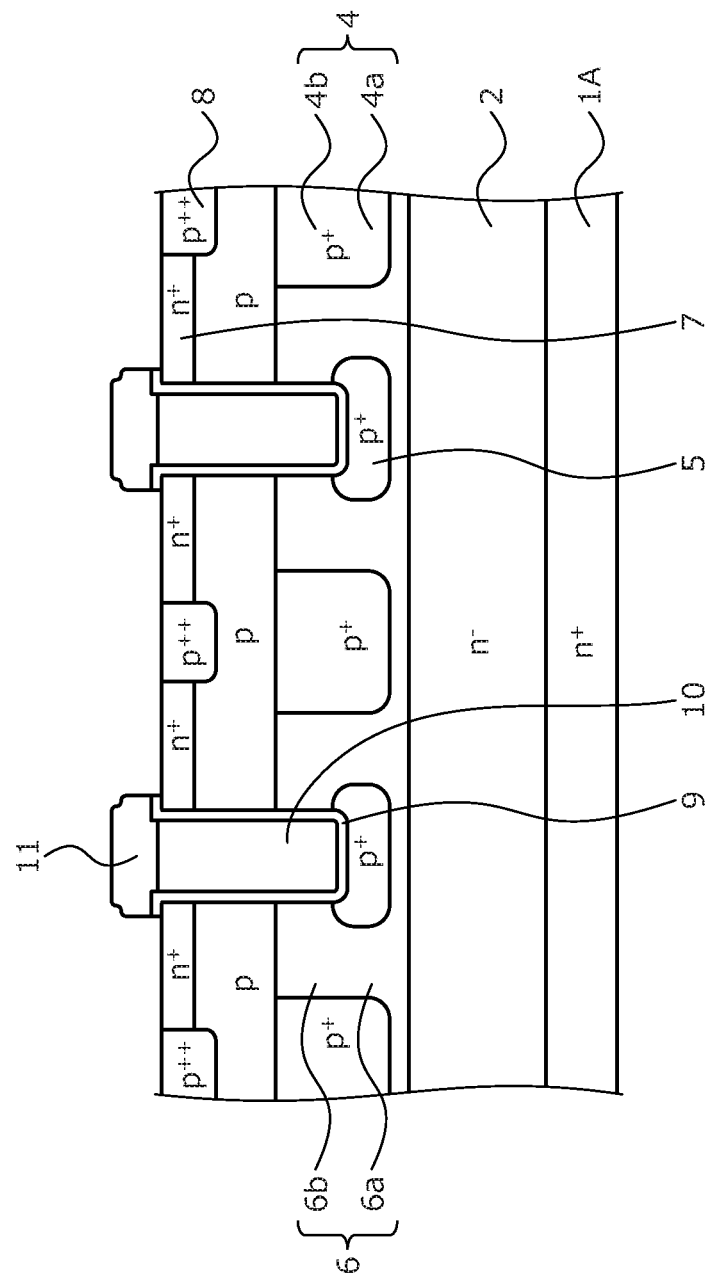

As depicted in FIG. 3L, an oxide film (the gate insulating film) is formed along the surface of the trench, on the bottom portion and the side portion of the trench. This oxide film may be formed by thermal oxidation at a temperature of about 1000 degrees C. in an oxygen atmosphere. This oxide film may also be deposited using a plasma CVD method or a vapor deposition method such as HTO.

A polysilicon layer doped with, for example, phosphorus atoms is provided on the gate insulating film 9. The polysilicon layer may be formed to fill the trench. The polysilicon layer is patterned by photolithography so that the polysilicon remains inside the trench. As a result, the gate electrode 10 is formed. A portion of the gate electrode 10 may protrude externally from the trench.

A film of, for example, phosphate glass is formed to have a thickness of about 1 μm to cover the gate insulating film 9 and the gate electrode 10 to form the interlayer insulating film 11. The interlayer insulating film 11 and the gate insulating film 9 are patterned by photolithography to form the contact hole in which the $n^+$ source region 7 and the $p^{++}$ contact region 8 are exposed. Thereafter, heat treatment (reflow) is performed to planarize the interlayer insulating film 11.

A conductive film of Ni or the like to form the source electrode 12 is formed in the contact hole and on the interlayer insulating film 11. The conductive film is patterned by photolithography so that the source electrode 12 remains only in the contact hole.

As depicted in FIG. 3M, the drain electrode 13 of nickel or the like is formed on the second main surface of the silicon carbide substrate 1A. Thereafter, heat treatment is performed in an inert gas atmosphere of about 1000 degrees C. to form the source electrode 12 and the drain electrode 13 that form ohmic junctions with the $n^+$ source region 7 and the $p^{++}$ contact region 8, and the silicon carbide substrate 1A.

An aluminum film having a thickness of about 5 μm is deposited on the first main surface of the silicon carbide substrate 1A by a sputtering method, and the aluminum is removed by photolithography so as to cover the source electrode 12 and the interlayer insulating film 11 to form the electrode pad 14.

A drain electrode pad 15 is formed by sequentially stacking, for example, titanium, nickel, and gold on the surface of the drain electrode 13. In this manner, the silicon carbide semiconductor element having the trench MOS structure depicted in FIG. 1 and FIG. 2 is completed.

The mesa shape was produced by two photolithography sessions in the manufacturing method described in the embodiment, as Example 1.

FIG. 4 is an enlarged diagram of image data showing the mesa shape of Example 1. As depicted in FIG. 4, the angle α formed by the silicon carbide substrate 1A and the mesa side face was about 15 degrees and the remaining thickness d of the p base layer 4 was about 0.7 μm. As depicted in FIG. 3G, the $p^{++}$ contact region 8 was formed spanning up to the inner side of a mesa upper face of the mesa portion 100, and the termination region 20 was formed spanning from a position contacting the p base layer 4 to the outer side.

The mesa shape was produced by two photolithography sessions in the manufacturing method described in the embodiment, as Example 2. The remaining thickness d of the p base layer 4 was about 0.7 μm. As depicted in FIG. 3H and FIG. 3I, the $p^{++}$-type contact region 8 was formed spanning up to the outer side of a mesa lower face of the mesa portion 100, and the termination region 20 was formed spanning from a position contacting the p++ contact region 8 to the outer side.

The mesa shape was produced by two photolithography sessions in the manufacturing method described in the embodiment, as Example 3. The remaining thickness d of the p base layer 4 was about 0.7 μm. As depicted in FIG. 3I, the $p^{++}$ contact region 8 was formed spanning up to the inner side of the mesa upper face of the mesa portion 100, and the termination region 20 was formed spanning from a position contacting the $p^{++}$ contact region 8 to the outer side. In this case, the implantation depth of the $p^{++}$ contact region 8 was 0.3 μm.

The manufacturing method of the mesa shape of the mesa portion 100 was changed in the manufacturing method described in the embodiment. For Comparative Example 1, a silicon oxide film having a thickness of 2.0 μm was deposited on the third silicon carbide epitaxial layer 3 using a CVD method and a resist was formed thereon to perform wet etching using buffered hydrofluoric acid. A silicon oxide mask having a taper angle of about 45 degrees was thereby formed. Dry etching using a $SF_6$ gas was performed to produce a mesa shape whose angle formed by the silicon carbide substrate 1A and the mesa side face was about 45 degrees. In this case, a sub-trench having a depth of about 0.1 μm was formed in the mesa end portion of the mesa portion 100.

In Comparative Example 2, the manufacturing method of the mesa shape was also changed in the manufacturing method described in the embodiment. For comparative Example 2, a resist was formed on the third silicon carbide epitaxial layer 3 to thereafter perform dry etching to remove the third silicon carbide epitaxial layer 3 by a thickness of about 1.0 μm. A resist was again formed to remove the third silicon carbide epitaxial layer 3 and the second silicon carbide epitaxial layer by a thickness of 1.0 μm by dry etching. In this case, the angle α formed by the silicon carbide substrate 1A and the mesa side face of the mesa portion 100 was about 15 degrees and the remaining thickness d of the p base layer 4 was about 0.3 μm.

In Comparative Example 3, in the manufacturing method described in Example 2, the region to form the p base layer 4 was set to be farther inward than the mesa side face of the mesa portion 100 and the p base 4 was not formed at a position at which the mesa side face and the first silicon carbide epitaxial layer 1 contact each other. The p$^{++}$ contact region 8 was formed spanning up to the outer side of the mesa lower face and the termination region 20 was formed spanning from a position contacting the p$^{++}$ contact region 8 to the outer side. In this case, ion implantation was performed such that the thickness of the p$^{++}$ contact region 8 in the region where the mesa side face and the first silicon carbide epitaxial layer 1 contact each other was 0.7 μm.

FIG. 5 is a table of leak generation in Examples 1 to 3 and Comparative Examples 1 to 3. For each of Examples 1 to 3 and Comparative Examples 1 to 3, current flowing between the source and the drain was measured and the average values of the voltage acquired when current of 1 μA flowed therebetween were compared for 10 elements.

As a result, it was confirmed that the current values in Examples 1 to 3 were smaller than those in Comparative Examples. The positions of the generation of the leak current in this case were observed using PHEMOS-1000 (manufactured by Hamamatsu Photonics K.K.). In Comparative Example 1 and Comparative Example 2, many leak generation positions were distributed in a mesa outer periphery portion and it is thought that the leak current increased due to the formation of the sub-trench and the reduction of the thickness of the p base layer 4. In Comparative Example 3, many leak generation positions were distributed spanning from the mesa side face to the mesa outer circumference portion and it is thought that the leak current increased due to ion-implanting Al at a high acceleration voltage and with a high dose amount.

Based on the above verification results, it was found that the generation of leak current during application of reverse voltage could be suppressed in each of the silicon carbide semiconductor elements of Examples 1 to 3.

Although the present invention has been described taking, as an example, a case where the main surface of the silicon carbide substrate including silicon carbide is set to be a (0001) surface and the MOS is configured on the (0001) surface in the embodiments the present invention is not limited hereto and various changes may be made thereto such as with a wide bandgap semiconductor and the plane direction of the substrate main surface.

Various changes may be made within the scope not departing from the spirit of the present invention and in the embodiments, for example, the dimensions, the impurity concentrations, and the like of the components are variously set in accordance with a required specification or the like. Although the first conductivity type is set to be an n-type and the second conductivity type is set to be a p-type in the embodiments, the present invention is similarly implemented when the first conductivity type is set to be a p-type and the second conductivity type is set to be an n-type.

According to the embodiments, the base layer formed in the silicon carbide epitaxial layer may be controlled to have a predetermined remaining thickness, and both the formation of the sub-trench and non-uniformity of the etching depth in the production of the mesa of the mesa portion may be suppressed by executing the plural dry etching sessions. Therefore, breakdown voltage defects in the element may be reduced.

According to the silicon carbide semiconductor element and the method of manufacturing a silicon carbide semiconductor element of the embodiments, a mesa having a predetermined shape may be produced easily at a predetermined position and a driving reliability of the element for a long time period may be achieved.

As described, the silicon carbide semiconductor element according to the present invention is useful for a high-voltage semiconductor element used in power converting equipment such as converters and inverters, and power supply devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:
1. A silicon carbide semiconductor element comprising:
a silicon carbide substrate of a first conductivity type;
a silicon carbide epitaxial layer of the first conductivity type formed on the silicon carbide substrate, and having a first surface, and a second surface facing the silicon carbide substrate;
a plurality of base layers of a second conductivity type selectively formed in the silicon carbide epitaxial layer of the first conductivity type;
a silicon carbide epitaxial layer of the second conductivity type formed on the first surface of the silicon carbide epitaxial layer of the first conductivity type;
a trench penetrating at least the silicon carbide epitaxial layer of the second conductivity type;
a mesa portion in a region of the silicon carbide epitaxial layer of the second conductivity type, exposing a remaining portion of a corresponding one of the plurality of base layers, the mesa portion having a first mesa side face and a second mesa side face, and a flat portion extending between the first and second mesa side faces of the mesa portion, each of the first mesa side face and the second mesa side face being formed in a second conductivity type region in either the silicon carbide epitaxial layer of the second conductivity type or the corresponding base layer of the second conductivity type, the flat portion being substantially parallel to the silicon carbide substrate, a first point in the silicon carbide epitaxial layer of the second conductivity type, contacting one end of the first mesa side face and the flat portion, having the same impurity concentration as that of a second point in the silicon carbide epitaxial layer of the second conductivity type, contacting an other end of the flat portion and the second mesa side face, the remaining portion of the corresponding base layer having a minimum thickness that is larger than 0.5 μm and smaller than 1.0 μm, the first mesa side face being inclined at a first angle with respect to a surface of the flat portion that is less than 45°, the second mesa side face being inclined at a second angle with respect to the surface of the flat portion that is less than 45°; and
a low-concentration ion implanted layer of the second conductivity type provided contacting an end portion of the corresponding one of the base layers of the silicon carbide epitaxial layer of the first conductivity type at the mesa portion and extending toward an outer side of the element, a bottom of the low-concentration ion implanted layer being closer to the first surface of the silicon carbide epitaxial layer of the first conductivity type than is a bottom of the corresponding one of the base layers.

2. The silicon carbide semiconductor element according to claim 1, wherein
the flat portion is located at a substantially central depth of the silicon carbide epitaxial layer of the second conductivity type.

3. The silicon carbide semiconductor element according to claim 1, wherein
the silicon carbide epitaxial layer of the second conductivity type has a first surface and a second surface, and is formed on the first surface of the silicon carbide epitaxial layer of the first conductivity type, the second surface of the silicon carbide epitaxial layer of the second conductivity type facing the first surface of the silicon carbide epitaxial layer of the first conductivity type,
the first mesa side face is formed from the first surface of the silicon carbide epitaxial layer of the second conductivity type to one end of the flat portion located within the silicon carbide epitaxial layer of the second conductivity type in a depth direction, and
the second mesa side face is formed from the other end of the flat portion to a portion located within the silicon carbide epitaxial layer of the first conductivity type.

4. The silicon carbide semiconductor element according to claim 1, further comprising a contact region selectively disposed in a surface layer of the silicon carbide epitaxial layer of the second conductivity type, wherein
the flat portion of the mesa portion is located deeper than a bottom of the contact region in a depth direction of the semiconductor element,
the mesa portion is formed outside of an active region of the semiconductor element in a plan view of the semiconductor element, and
the contact region is disposed in the active region.

5. The silicon carbide semiconductor element according to claim 1, wherein each of the first mesa side face and the second mesa side face is formed only in the second conductivity type region.

6. The silicon carbide semiconductor element according to claim 1, wherein
the first mesa side face is formed in the silicon carbide epitaxial layer of the second conductivity type, and
a portion of the second mesa side face is formed in the corresponding base layer of the second conductivity type.

7. The silicon carbide semiconductor element according to claim 1, wherein each of the first angle and the second angle is in a range of 10° to 30°.

8. A silicon carbide semiconductor element comprising:
a silicon carbide substrate of a first conductivity type;
a silicon carbide epitaxial layer of the first conductivity type formed on the silicon carbide substrate;
a plurality of base layers of a second conductivity type selectively formed in the silicon carbide epitaxial layer of the first conductivity type;
a silicon carbide epitaxial layer of the second conductivity type formed on the silicon carbide epitaxial layer of the first conductivity type;
a trench penetrating at least the silicon carbide epitaxial layer of the second conductivity type;
a mesa portion in a region of the silicon carbide epitaxial layer of the second conductivity type, exposing a remaining portion of a corresponding one of the plurality of base layers, the mesa portion having a first mesa side face and a second mesa side face, and a flat portion extending between the first and second mesa side faces of the mesa portion, each of the first mesa side face and the second mesa side face being formed in a second conductivity type region in either the silicon carbide epitaxial layer of the second conductivity type or the corresponding base layer of the second conductivity type, the flat portion being substantially parallel to the silicon carbide substrate, a first point in the silicon carbide epitaxial layer of the second conductivity type, contacting one end of the first mesa side face and the flat portion, having the same impurity concentration as that of a second point in the silicon carbide epitaxial layer of the second conductivity type, contacting an other end of the flat portion and the second mesa side face, the remaining portion of the corresponding base layer having a minimum thickness that is larger than 0.5 μm and smaller than 1.0 μm, the first mesa side face being inclined at a first angle with respect to a surface of the flat portion that is less than 45°, the second mesa side face being inclined at a second angle with respect to the surface of the flat portion that is less than 45°; and
a low-concentration ion implanted layer of the second conductivity type is provided contacting the first mesa side face or the second mesa side face of the mesa portion and extending toward an outer side of the element, the corresponding one of the base layers extending to the outer side of the element so that an end of the corresponding one of the base layers is located at the outer side of the element and beneath the low-concentration ion implanted layer in a plan view.

* * * * *